(12) United States Patent
Yan et al.

(10) Patent No.: US 10,867,498 B2
(45) Date of Patent: Dec. 15, 2020

(54) SMOKE ALARM SYSTEM

(71) Applicant: CONTEMPORARY AMPEREX TECHNOLOGY CO., LIMITED, Ningde (CN)

(72) Inventors: Zhiwei Yan, Ningde (CN); Fangjie Zhou, Ningde (CN); Fuming Ye, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 0 days.

(21) Appl. No.: 16/426,695

(22) Filed: May 30, 2019

(65) Prior Publication Data

US 2020/0020217 A1    Jan. 16, 2020

(30) Foreign Application Priority Data

Jul. 12, 2018  (CN) ...................... 2018 2 1101422 U

(51) Int. Cl.
*G08B 17/10* (2006.01)
*G01K 3/00* (2006.01)
(Continued)

(52) U.S. Cl.
CPC .............. *G08B 17/10* (2013.01); *G01K 3/005* (2013.01); *H03K 19/20* (2013.01); *H03M 1/124* (2013.01)

(58) Field of Classification Search
CPC ........ G08B 17/10; G01K 3/005; H03K 19/20; H03M 1/124

(Continued)

(56) References Cited

U.S. PATENT DOCUMENTS 4,420,746 A   12/1983   Malinowski
4,749,986 A    6/1988   Otani et al.
(Continued)

FOREIGN PATENT DOCUMENTS

| CN | 102122811 B | 11/2013 |
| CN | 102637337 B | 8/2015 |
| EP | 1253565 A2 | 10/2002 |

OTHER PUBLICATIONS

Texas Instruments, MSP430 Mixed Signal Microcontroller, (Year: 2013).*

(Continued)

*Primary Examiner* — Zhen Y Wu
(74) *Attorney, Agent, or Firm* — Heslin Rothenberg Farley & Mesiti P.C.

(57) ABSTRACT

A smoke alarm system comprises a smoke alarm, a temperature detector, a first sampling circuit, a second sampling circuit and an analysis module; a first terminal of the first sampling circuit is connected to the smoke alarm, and a second terminal is connected to a first input terminal of the analysis module; the first sampling circuit is used for sampling from the smoke alarm to obtain a smoke sample value which is then output to the analysis module; a first terminal of the second sampling circuit is connected to the temperature detector, and a second terminal is connected to a second input terminal of the analysis module; the second sampling circuit is used for sampling from the temperature detector to obtain a temperature sample value which is then output to the analysis module; and the analysis module determines whether a smoke alarm signal is generated.

19 Claims, 14 Drawing Sheets

(51) Int. Cl.
*H03K 19/20* (2006.01)
*H03M 1/12* (2006.01)

(58) Field of Classification Search
USPC .......................................................... 340/628
See application file for complete search history.

(56) References Cited

U.S. PATENT DOCUMENTS

| | | | | |
|---|---|---|---|---|
| 5,563,578 | A * | 10/1996 | Isenstein | G08B 17/117 |
| | | | | 340/521 |
| 5,670,948 | A * | 9/1997 | Mochizuki | G08B 17/107 |
| | | | | 250/573 |
| 5,818,326 | A | 10/1998 | Winterble et al. | |
| 6,107,925 | A * | 8/2000 | Wong | G08B 17/10 |
| | | | | 340/628 |
| 6,426,703 | B1 * | 7/2002 | Johnston | G08B 29/183 |
| | | | | 340/628 |
| 6,768,294 | B1 * | 7/2004 | Moldavsky | G01D 5/248 |
| | | | | 324/76.39 |
| 2004/0132398 | A1 * | 7/2004 | Sharp | H05K 7/20609 |
| | | | | 454/184 |
| 2008/0182215 | A1 * | 7/2008 | Sid | G01N 33/004 |
| | | | | 431/18 |
| 2011/0291843 | A1 * | 12/2011 | Andersen | G08B 17/113 |
| | | | | 340/584 |
| 2013/0154659 | A1 * | 6/2013 | Cooke | H03M 3/30 |
| | | | | 324/469 |
| 2015/0206423 | A1 * | 7/2015 | Warmack | G08B 3/10 |
| | | | | 340/514 |
| 2016/0345394 | A1 * | 11/2016 | Warren | G01N 21/53 |
| 2016/0361553 | A1 * | 12/2016 | Kaula | A61N 1/36014 |
| 2018/0075733 | A1 * | 3/2018 | Brown | G08B 29/145 |
| 2019/0180590 | A1 * | 6/2019 | Fischer | G08B 17/107 |

OTHER PUBLICATIONS

Partial European Search Report for European Patent Application No. 19177461.1 dated Dec. 6, 2019.
Extended European Search Report for European Patent Application No. 19177461.1 dated Mar. 13, 2020.

* cited by examiner

SMOKE ALARM SYSTEM

CROSS-REFERENCE TO RELATED APPLICATION

This application claims the priority benefit of Chinese Patent Application Serial No. 201821101422.8 filed on Jul. 12, 2018 and entitled "Smoke Alarm System", the disclosure of which is incorporated by reference herein in its entirety.

TECHNICAL FIELD

The present disclosure relates to smoke alarm technologies, especially a smoke alarm system.

BACKGROUND

Fire occurs more and more frequently due to an increase in electricity consumption of modern households and industries, and people are watching out more for fires. At present, smoke alarms have been widely used and play an important role in people's lives, especially at such places as energy storage stations which are susceptible to fire and where a fire would cause disastrous consequences, so people would rather have a false alarm than to miss a fire. Therefore, currently used smoke alarms are highly sensitive.

SUMMARY

The present disclosure is at least directed to provide a smoke alarm system, which may avoid a false alarm because of oversensitivity of smoke alarms, so as to avoid waste of manpower and material resources as much as possible.

In order to solve the above-described technical problem, an embodiment of the present disclosure provides a smoke alarm system, including: a smoke alarm, a temperature detector, a first sampling circuit, a second sampling circuit and an analysis module; a first terminal of the first sampling circuit is connected to the smoke alarm, and a second terminal of the first sampling circuit is connected to a first input terminal of the analysis module; the first sampling circuit is used for sampling from the smoke alarm to obtain a smoke sample value which is then output to the analysis module; a first terminal of the second sampling circuit is connected to the temperature detector, and a second terminal of the second sampling circuit is connected to a second input terminal of the analysis module; the second sampling circuit is used for sampling from the temperature detector to obtain a temperature sample value which is then output to the analysis module; and the analysis module is used for determining whether a smoke alarm signal is generated in accordance with the smoke sample value and the temperature sample value.

Compared with the existing technologies, in the embodiment of the present disclosure, the first sampling circuit samples from the smoke alarm to obtain a smoke sample value which is then output to the analysis module; and the second sampling circuit samples from the temperature detector to obtain a temperature sample value which is then output to the analysis module. That is, a smoke detection and a temperature detection are combined to determine whether a smoke alarm signal is generated, so as to avoid a false alarm because of oversensitivity of a smoke alarm, thereby avoiding waste of manpower and material resources as much as possible.

Further, the first sampling circuit comprises a first voltage divider branch and at least two first filter branches; the first input terminal of the analysis module and the first filter branch are equal in number and are connected in one-to-one correspondence; a first terminal of the first voltage divider branch is connected to the first terminal of the smoke alarm; and a first terminal of each first filter branch is connected to the first terminal of the first voltage divider branch, and a second terminal of each first filter branch is connected to an input terminal of a corresponding analysis module. In this case, at least two first filter branches are designed to output at least two smoke sample values. That is, a design of multi-channel sampling of smoke concentration is used to replace a design of single-channel sampling in the existing technologies, which may avoid a false alarm due to error caused by single-channel sampling.

Further, the first sampling circuit comprises a first voltage divider branch and a first filter branch, a first terminal of the first voltage divider branch is connected to a first terminal of the smoke alarm; a first terminal of the first filter branch is connected to the first terminal of the first voltage divider branch, and a second terminal of the first filter branch is connected to the first input terminal of the analysis module. In this case, a basic structure of the first sampling circuit is provided.

Further, a second terminal of the first voltage divider branch serves as a power supply terminal and a second terminal of the smoke alarm is a ground terminal. In this case, a preferable circuit connection is provided, that is, an excitation voltage is applied to the smoke alarm via the first voltage divider branch; in other words, the excitation voltage may not be directly applied to the smoke alarm, thereby avoiding the following problem: short circuit because of a worn conducting wire, leading to an abnormal power supply to a printed circuit board, and further affecting sampling.

Further, there is a temperature detector and a second sampling circuit, the second sampling circuit comprises a second voltage divider branch and a second filter branch; a first terminal of the second voltage divider branch is connected to the first terminal of the temperature detector; and a first terminal of the second filter branch is connected to the first terminal of the second voltage divider branch, and a second terminal of the second filter branch is connected to the second input terminal of the analysis module. Alternately, the second sampling circuit further comprises a voltage follower branch via which the second voltage divider branch is connected to the second filter branch. In this case, a basic structure of the second sampling circuit is provided.

Further, there are a plurality of temperature detectors which are in one-to-one correspondence to a plurality of second sampling circuits; the second input terminals of the analysis module and the second sampling circuits are equal in number and are connected in one-to-one correspondence; the first terminal of the second sampling circuit is connected to a first terminal of the temperature detector, and the second terminal of the second sampling circuit is connected to a second input terminal of a corresponding analysis module. In this case, a plurality of temperature detectors are provided which may obtain a plurality of temperature sample values, thereby temperature detection is more reliable.

Further, the second sampling circuit comprises a second voltage divider branch and a second filter branch; a first terminal of the second voltage divider branch is connected to the first terminal of the temperature detector; and the first terminal of the second filter branch is connected to the first terminal of the second voltage divider branch, and a second terminal of the second filter branch is connected to a second input terminal of the analysis module. In this case, a basic structure of the second sampling circuit provided.

Further, the second sampling circuit further comprises a voltage follower branch via which the second voltage divider branch is connected to the second filter branch. In this case, an optimized structure of the second sampling circuit is provided by adding a voltage follower branch, which may enhance stability of detection signals.

Further, the analysis module comprises a logic gate circuit and a comparator circuit; the second terminal of the first sampling circuit is connected to a first input terminal of the logic gate circuit; the comparator circuits and the second sampling circuits are equal in number and are connected in one-to-one correspondence to the second sampling circuits, the second terminal of each second sampling circuit is connected to an input terminal of a corresponding comparator circuit, and the output terminal of the comparator circuit is connected to a second input terminal of the logic gate circuit. There is one second sampling circuit and the logic gate circuit is an AND gate; or there are a plurality of second sampling circuits, and the logic gate circuit comprises an AND gate and an OR gate; the second terminal of the first sampling circuit is connected to a first input terminal of the AND gate; and the output terminal of each comparator circuit is connected to an input terminal of the OR gate, and an output terminal of the OR gate is connected to a second input terminal of the AND gate. In this case, a circuit solution of the analysis module is provided.

Further, the analysis module comprises a logic gate circuit and a comparator circuit; there are a plurality of second sampling circuits, and the comparator circuit and the second sampling circuit are equal in number and are connected in one-to-one correspondence; the logic gate circuit comprises an AND gate and two OR gates; the second terminal of each first filter branch is connected to an input terminal of the first OR gate, an output terminal of the first OR gate is connected to the first input terminal of the AND gate; and the second terminal of each second sampling circuit is connected to an input terminal of a corresponding comparator circuit, and an output terminal of each comparator circuit is connected to an input terminal of a second OR gate; and an output terminal of the second OR gate is connected to a second input terminal of the AND gate. In this case, a circuit solution of the analysis module when there are at least two first filter branches in the first sampling circuit and a plurality of second sampling circuits is provided.

Further, the smoke alarm system is applied to an electric cabinet; the smoke alarm is configured at the top of the electric cabinet. There are three temperature detectors, a first temperature detector is configured inside the electric cabinet, a second temperature detector is configured at the top of and a third temperature detector is configured at an air outlet of the electric cabinet. In this case, a specific application scenario of the smoke alarm system, as well as specific positions of the smoke alarm and the temperature detector is provided.

DETAILED DESCRIPTION

Embodiments of the present disclosure will be described in detail below with reference to the accompanying drawings in order to make the objective, technical solutions and advantages of the present disclosure clearer. However, it will be apparent to skilled persons in the art that, in the embodiments of the present disclosure, numerous technical details are set forth in order to provide readers with a better understanding of the present application. However, the technical solutions claimed in the present application may be implemented without these technical details and with various changes and modifications based on the following embodiments.

The inventor finds during the invention that at least the following problems are present in existing technologies: an arrangement of high sensitiveness of a smoke alarm is advantageous for avoiding missing any possible fires, but results in some problems. For example, for each smoke alarm, an emergent firefighting shall be prepared to take immediately, causing significant consumption of manpower and material resources.

Figure 1:
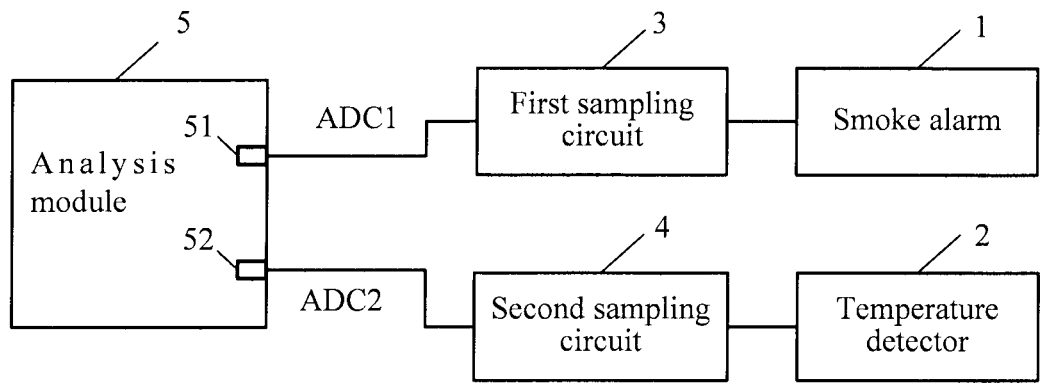
FIG. 1 is a block schematic diagram of a smoke alarm system in accordance with the present disclosure.

In view of this, an embodiment of the present disclosure relates to a smoke alarm system, as shown in FIG. 1, including a smoke alarm 1, a temperature detector 2, a first sampling circuit 3, a second sampling circuit 4, and an analysis module 5. A first terminal of the first sampling circuit 3 is connected to the smoke alarm 1, and a second terminal of the first sampling circuit 3 is connected to a first input terminal 51 of the analysis module 5; the first sampling circuit is used for sampling from the smoke alarm 2 to obtain a smoke sample value ADC1 which is then output to the analysis module 5. A first terminal of the second sampling circuit 4 is connected to the temperature detector 2, and a second terminal of the second sampling circuit 4 is connected to a second input terminal 52 of the analysis module 5; the second sampling circuit 4 is used for sampling from the temperature detector 2 to obtain a temperature sample value ADC2 which is then output to the analysis module 5. The analysis module 5 is used for determining whether a smoke alarm signal is generated in accordance with the smoke sample value ADC1 and the temperature sample value ADC2. The skilled person can understand that the temperature detector may be a temperature sensor.

In this embodiment of the present disclosure, compared with the existing technologies, the first sampling circuit 3 samples from the smoke alarm 1 to obtain a smoke sample value ADC1 which is then output to the analysis module 5; the second sampling circuit 4 samples from the temperature detector 2 to obtain a temperature sample value ADC2 which is then output to the analysis module 5. That is, the smoke detection ADC1 and the temperature detection ADC2 are combined to determine whether a smoke alarm signal is generated, so as to avoid a false alarm because of oversensitivity of a smoke alarm, so as to avoid waste of manpower and material resources as much as possible.

Details of the smoke alarm system of the present embodiment are specifically described below. The following content is merely for facilitating understanding the details provided, but is not indispensable for implementing the solution.

Figure 2A:
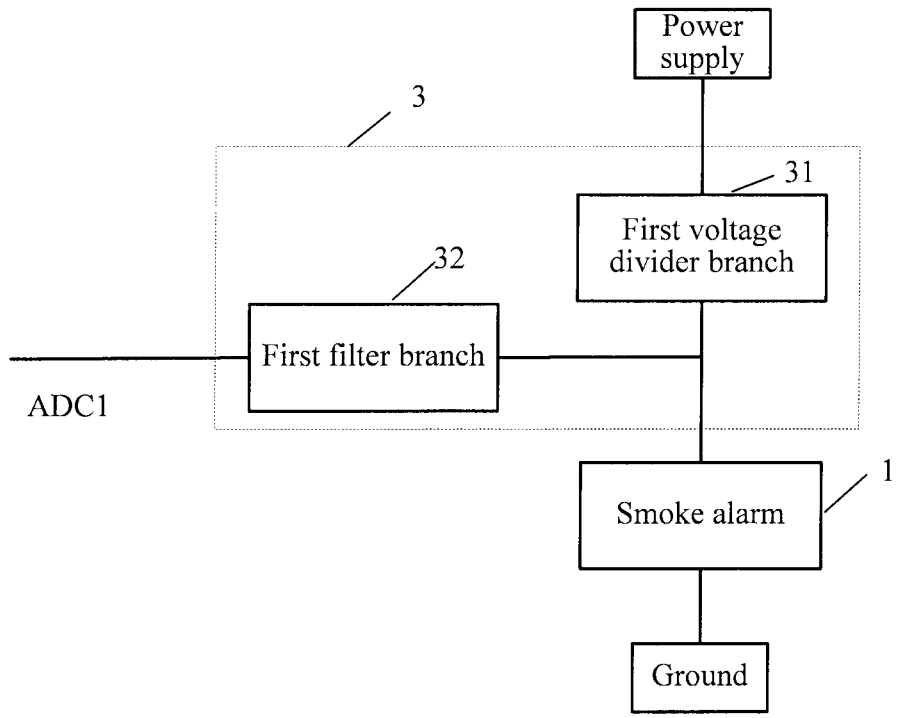
FIG. 2A is a block schematic diagram showing more details of a connection between a first sampling circuit and a smoke alarm of the smoke alarm system.

As shown in FIG. 2A, the first sampling circuit 3 includes a first voltage divider branch 31 and a first filter branch 32. A first terminal of the first voltage divider branch 31 is connected to a first terminal of the smoke alarm 1, a first terminal of the first filter branch 32 is connected to the first terminal of the first voltage divider branch 31, and a second terminal of the first filter branch 32 is used to output the smoke sample value ADC1.

Either a second terminal of the first voltage divider branch 31 or a second terminal of the smoke alarm 1 serves as a power supply terminal connected to a voltage source VDD, while the other serves as a ground terminal connected to ground GND. Preferably, the second terminal of the first voltage divider branch 31 serves as the power supply terminal connected to the voltage source VDD, while the second terminal of the smoke alarm 1 serves as the ground terminal connected to the ground GND. In this way of connection, an excitation voltage is applied to the smoke alarm 1 via the first voltage divider branch 31; in other words, the excitation voltage may not be directly applied to the smoke alarm 1, thereby avoiding the following problem: short circuit because of a worn connecting line, leading to an abnormal power supply to a printed circuit board, and further affecting sampling.

The smoke alarm 1 and the first sampling circuit 3 form a smoke detecting module for detecting smoke concentration. When the smoke concentration detected by the smoke alarm 1 does not reach a preset concentration threshold, the smoke alarm 1 is equivalent to a switch that is in a turn-off state, the branch where the first voltage divider branch 31 and the smoke alarm 1 locate are in an OFF state, and the smoke sample value ADC1 output by the second terminal of the first filter branch 32 is at a low level. When the smoke concentration detected by the smoke alarm 1 reaches the preset concentration threshold, the smoke alarm 1 is equivalent to a switch that is in a turn-on state, the branch where the first voltage divider branch 31 and the smoke alarm 1 locate are in an ON state, and the smoke sample value ADC1 output by the second terminal of the first filter branch 32 is at a high level.

It should be noted that, in this case, the smoke sample value ADC1 at a low level indicates that the smoke concentration has not reached the preset concentration threshold, while the smoke sample value ADC1 at a high level indicates that the smoke concentration has reached the preset concentration threshold, however the present disclosure is not limited thereto. In another example, the smoke alarm 1 is equivalent to a switch that is in a turn-on state when the smoke concentration has not reached the preset concentration threshold, while the smoke alarm 1 is equivalent to a switch that is in a turn-off state when the smoke concentration has reached the preset concentration threshold. At this time, the smoke sample value ADC1 at a high level indicates that the smoke concentration has not reached the preset concentration threshold, while the smoke sample value ADC1 at a low level indicates that the smoke concentration has reached the preset concentration threshold.

Figure 2B:
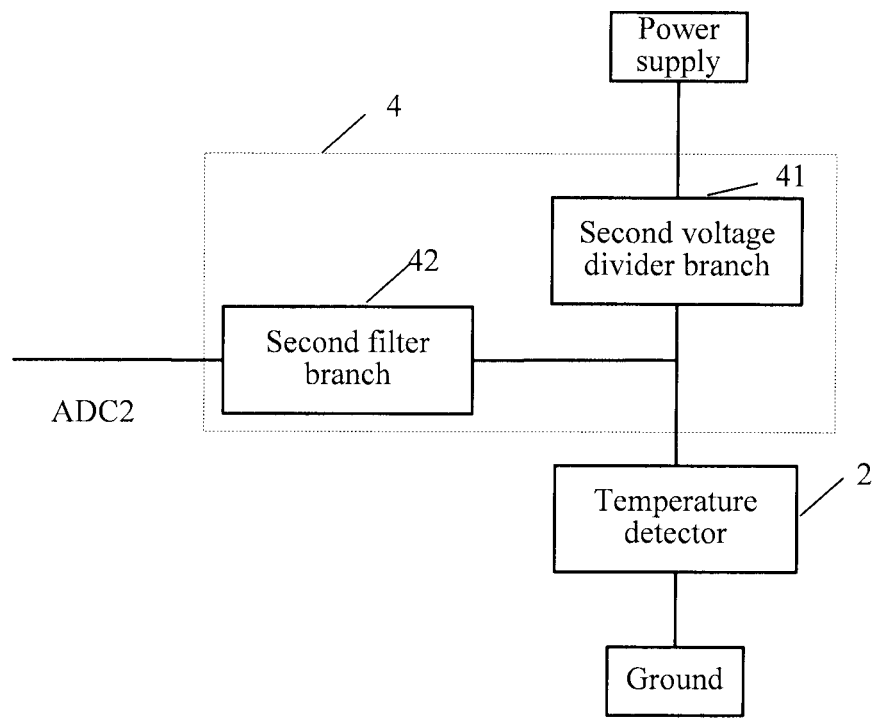
FIG. 2B is a block schematic diagram showing more details of a connection between a second sampling circuit and a temperature detector of the smoke alarm system.

As shown in FIG. 2B, the second sampling circuit 4 comprises a second voltage divider branch 41 and a second filter branch 42. A first terminal of the second voltage divider branch 41 is connected to the first terminal of the temperature detector 2, the first terminal of the second filter branch 42 is connected to the first terminal of the second voltage divider branch 41, and a second terminal of the second filter branch 42 is used to output the temperature sample value ADC2.

Either a second terminal of the second voltage divider branch 41 or a second terminal of the temperature detector 2 serves as a power supply terminal connected to a voltage source VDD, while the other is a ground terminal connected to the ground GND. Preferably, the second terminal of the second voltage divider branch 41 serves as the power supply terminal connected to the voltage source VDD, while the second terminal of the temperature detector 2 is the ground terminal connected to the ground GND.

Figure 2C:
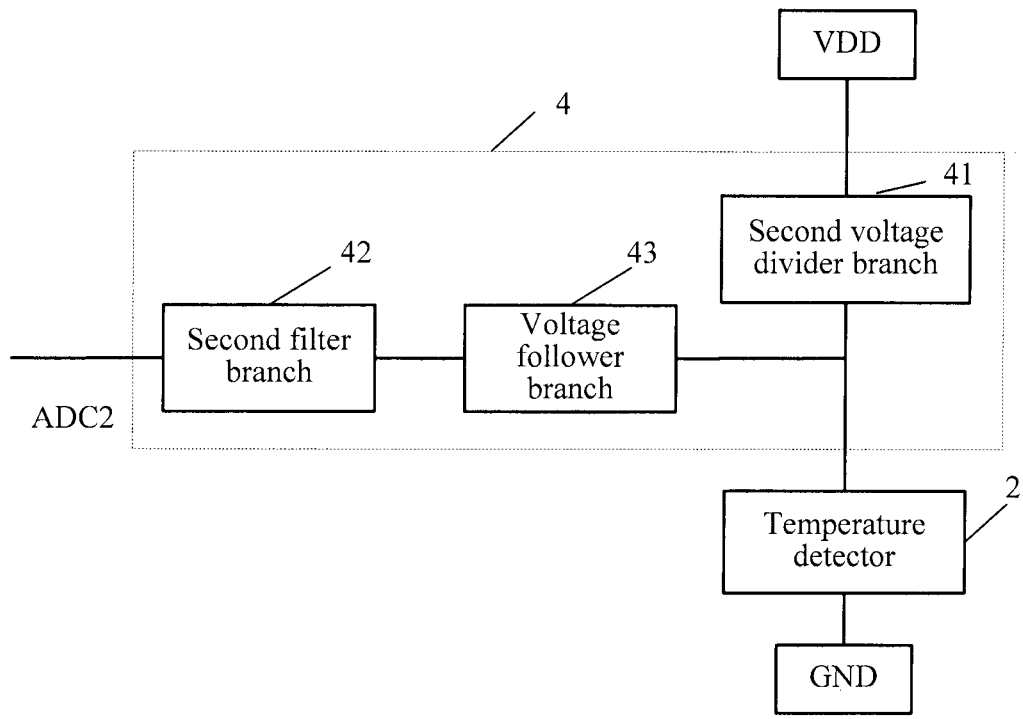
FIG. 2C is a block schematic diagram showing that the second sampling circuit of the smoke alarm system comprises a voltage follower branch.

Preferably, as shown in FIG. 2C, the second sampling circuit 4 further includes a voltage follower branch 43 via which the second voltage divider branch 41 is connected to the second filter branch 42. The added voltage follower branch 43 may enhance stability of detection signals.

The temperature detector 2 and the second sampling circuit 3 form a temperature detecting module for detecting ambient temperature. The specific type of the temperature detector 2 is not limited and may be any device capable of detecting ambient temperature. For example, the temperature detector 2 may be a positive temperature coefficient thermistor whose resistance value increases as temperature rises. When the ambient temperature changes, the resistance value of the thermistor also changes, so that voltage values at both terminals of the temperature detector 2 change, thereby the temperature sample value ADC2 output by the second terminal of the second filter branch 42 changes. That is, the temperature sample value ADC2 may reflect the ambient temperature.

The smoke alarm system may be applied to an energy storage system, and may be used for performing smoke alarm for an electric cabinet in the energy storage system. Specifically, the smoke alarm 1 may be configured at the top of the electric cabinet, and the temperature detector 2 may be configured at any place such as the top, the interior, or an air outlet of the electric cabinet. The first sampling circuit 3, the second sampling circuit 4, and the analysis module 5 may be integrated on one printed circuit board which is configured inside the electric cabinet; the first sampling circuit 3 is electrically connected to the smoke alarm 1 via a wire, and the second sampling circuit 4 is electrically connected to the temperature detector 2 via a wire. Alternatively, the first sampling circuit 3 and the smoke alarm 1 may be integrated, that is, an existing smoke alarm device integrated with the first sampling circuit 31 and the smoke alarm 1 may be directly used; the second sampling circuit 4 and the analysis module 5 may be integrated on a printed circuit board to be configured inside the electric cabinet, the analysis module 5 is further electrically connected to the first sampling circuit 31 in the smoke alarm device via a wire, and the second sampling circuit 4 is electrically connected to the temperature detector 2 via a wire. In addition, the voltage source VDD and the ground GND may also be integrated on the printed circuit board, and the smoke detecting module and the temperature detecting module may be powered by a same voltage source VDD or may be powered by different voltage sources.

Figure 3A:
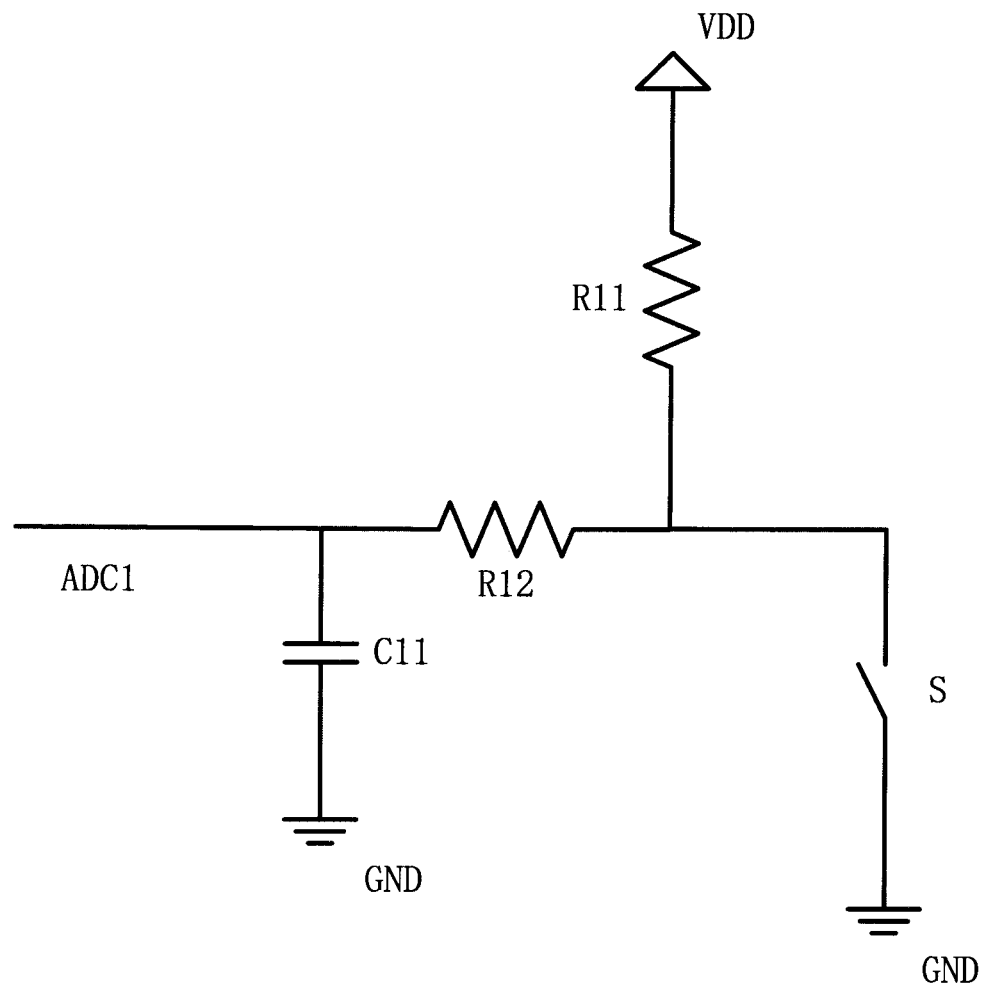
FIG. 3A is a schematic circuit diagram showing a connection between the first sampling circuit and the smoke alarm of the smoke alarm system.

FIG. 3A is a schematic circuit diagram showing a connection between the first sampling circuit and the smoke alarm of the smoke alarm system. The smoke alarm 1 includes a smoke detector (not shown) and a switch S. When the smoke concentration detected by the smoke detector exceeds a preset concentration threshold, the switch S is controlled to be ON so that the circuit is turned on. In FIG. 3A, the switch S is used to exemplarily show the connection relationship between the smoke alarm 1 and the first sampling circuit 3, but the actual structure of the smoke alarm 1 is not limited in any way.

The first voltage divider branch 31 is a voltage divider resistor R11. A first terminal of the voltage divider resistor R11 is connected to a first terminal of the switch S in the smoke alarm 1. Being used as a power supply terminal, a second terminal of the voltage divider resistor R11 is connected to the voltage source VDD. Being used as a ground terminal, a second terminal of the switch S in the smoke alarm 1 is connected to the ground GND.

The first filter branch 32 includes a resistor R12 and a capacitor C11. A first terminal of the resistor R12 is connected to the first terminal of the voltage divider resistor R11, and a second terminal of the resistor R12 is used for grounding via the capacitor C11 and is used for outputting the smoke sample value ADC1.

Figure 3B:
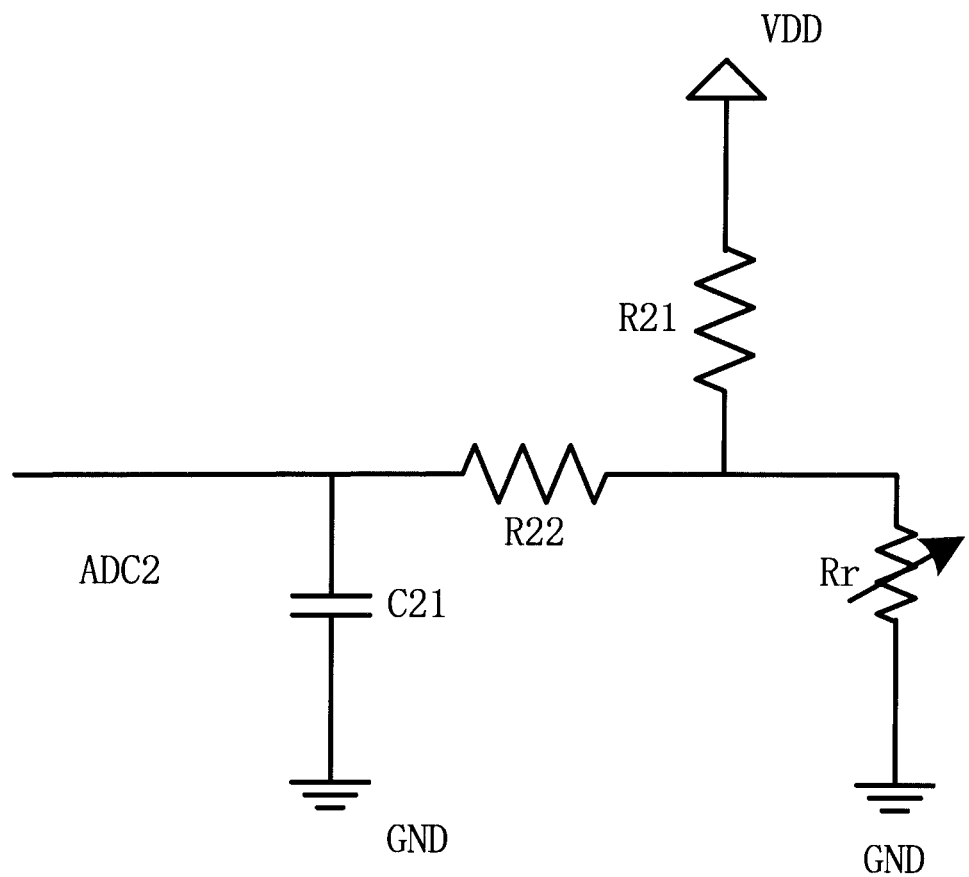
FIG. 3B is a schematic circuit diagram showing a connection between the second sampling circuit and the temperature detector of the smoke alarm system.

FIG. 3B is a schematic circuit diagram showing a connection between the second sampling circuit and the temperature detector of the smoke alarm system. The temperature detector 2 is described by taking a thermistor Rr as an example. The second voltage divider branch 41 is a voltage divider resistor R21. A first terminal of the voltage divider resistor R21 is connected to a first terminal of the thermistor Rr. As a power supply terminal, a second terminal of the voltage divider resistor R21 is connected to the voltage source VDD. As a ground terminal, a second terminal of the thermistor Rr is connected to the ground GND.

The second filter branch 42 includes a resistor R22 and a capacitor C21. A first terminal of the resistor R22 is connected to the first terminal of the voltage divider resistor R21, and a second terminal of the resistor R22 is used for grounding via the capacitor C21 and is used for outputting the temperature sample value ADC2.

Figure 3C:
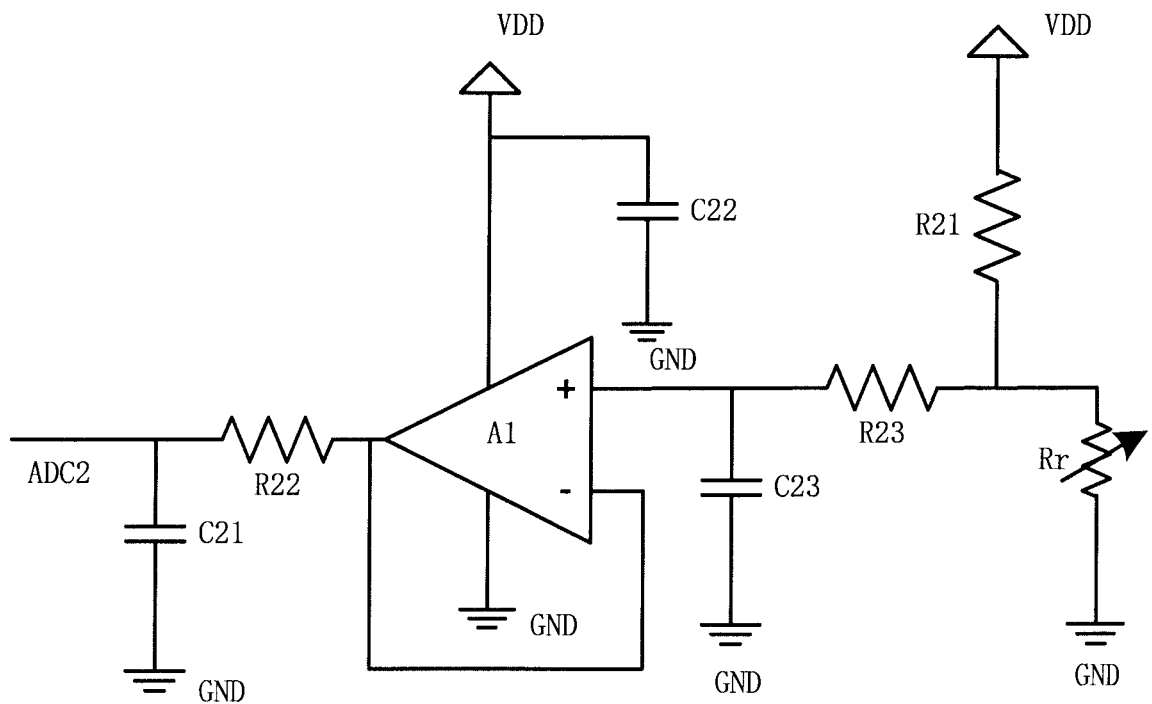
FIG. 3C is a schematic circuit diagram showing that the second sampling circuit of the smoke alarm system comprises a voltage follower branch.

FIG. 3C is a schematic circuit diagram showing that the second sampling circuit of the smoke alarm system includes a voltage follower branch. The second voltage divider branch 41 is connected to the second filter branch 42 via a voltage follower branch 43. Specifically, the voltage follower branch 43 includes an amplifier A1, a resistor R23, a capacitor 22, and a capacitor 23. A non-inverting input terminal of the amplifier A1 is connected to a first terminal of the voltage divider resistor R21 via the resistor R23 and to the ground GND via the capacitor 23. An inverting input terminal of the amplifier A1 is connected to an output terminal of the amplifier A1. The output terminal of the amplifier A1 is connected to a first terminal of the resistor R22. The voltage source VDD is connected to a power supply terminal of the amplifier A1 and is connected to the ground GND via the capacitor 22.

It shall be noted that the first sampling circuit 3 may further include a voltage follower branch via which the first voltage divider branch 31 is connected to the first filter branch 32. The specific structure of the voltage follower branch in the first sampling circuit 3 may be or not be the same as the specific voltage follower branch 43 in the second sampling circuit 4, which is not limited herein.

Figure 4A:
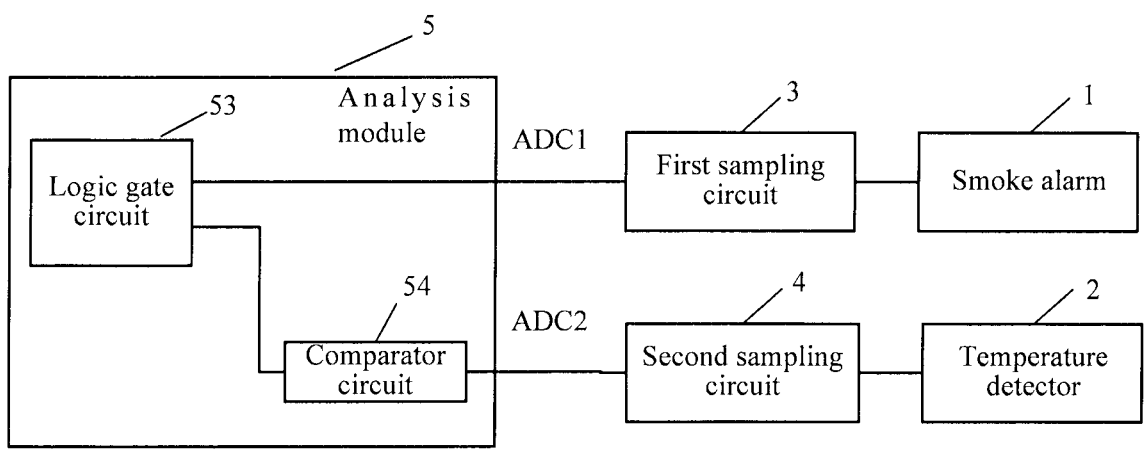
FIG. 4A is a block schematic diagram of an analysis module of the smoke alarm system.

As shown in FIG. 4A, the analysis module 5 includes a logic gate circuit 53 and a comparator circuit 54; the second terminal of the first sampling circuit 3 is connected to a first input terminal of the logic gate circuit 53; the comparator circuits 54 and the second sampling circuits 4 are equal in number and are in one-to-one correspondence, the second terminal of each of the second sampling circuits 4 is connected to an input terminal of one of the comparator circuits 54, and an output terminal of each of the comparator circuits 54 is connected to a second input terminal of the logic gate circuit 53. The first input terminal of the logic gate circuit 53 forms the first input terminal 51 of the analysis module 5, and an input terminal of the comparator circuit 54 forms the second input terminal 52 of the analysis module 5. It shall be noted that FIG. 4A only shows a case where the analysis module 5 includes one comparator circuit when there is one temperature detector 2, however the present disclosure is not limited thereto.

Figure 4B:
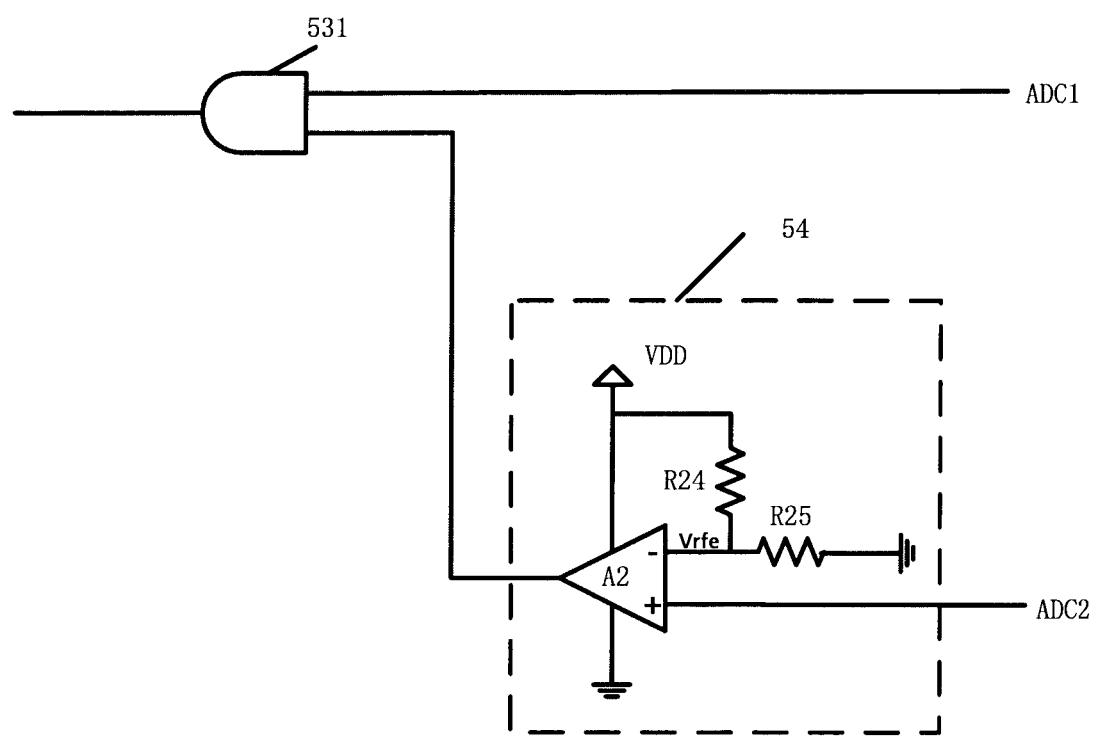
FIG. 4B is a schematic circuit diagram of the analysis module when there is one temperature detector in the smoke alarm system.

FIG. 4B is a schematic circuit diagram of the analysis module 5 when there is one temperature detector 2. When there is one temperature detector 2, there is one second sampling circuit, there is one comparator 54, and the logic gate circuit 53 is an AND gate 531.

Specifically, the second terminal of the first sampling circuit is connected to a first input terminal of the AND gate 531 to output the smoke sample value ADC1 to the AND gate 531. The second terminal of the second sampling circuit is connected to the input terminal of the comparator circuit 54 so as to output the temperature sample value ADC2 to the comparator circuit 54. The output terminal of the comparator circuit 54 is connected to a second input terminal of the AND gate 531.

The comparator circuit 54 includes a comparator A2, a resistor R24, and a resistor R25. A non-inverting input terminal of the comparator A2 forms the input terminal of the comparator circuit 54, that is, the non-inverting input terminal of the comparator A2 is connected to the second terminal of the second sampling circuit 4 to receive the temperature sample value ADC2. An inverting input terminal of the comparator A2 is connected to the voltage source VDD via the resistor R24 and connected to the ground GND via the resistor R25. The voltage source VDD, the resistor R24 and the resistor R25 provide a reference voltage Vrfe to the inverting input terminal of the comparator A2. The resistance values of the resistors R24 and R25 may be set as needed, so that the reference voltage Vrfe meets design requirements. The comparator A2 receives the temperature sample value ADC2 output by the second sampling circuit 4, compares the temperature sample value ADC2 with the reference voltage Vrfe to output a comparison result. The comparator A2 outputs a high level voltage if the temperature sample value ADC2 is higher than the reference voltage Vrfe, but a low level voltage otherwise.

Besides, with reference to FIG. 3B, the thermistor Rr has a positive temperature coefficient, that is, the higher the temperature is, the larger the resistance value of the thermistor Rr is, and the larger the temperature sample value ADC2 is. The value of the reference voltage Vrfe can be set as the temperature sample value ADC2 when the ambient temperature has just reached the preset temperature threshold. Therefore, when the ambient temperature has not reached the preset temperature threshold, the temperature sample value ADC2 is smaller than the reference voltage Vrfe, and the comparator A2 outputs a low level voltage. When the ambient temperature exceeds the preset temperature threshold, the temperature sample value ADC2 is greater than the reference voltage Vrfe, and the comparator A2 outputs a high level voltage to the second input terminal of the AND gate 531.

The first sampling circuit 3 outputs a high-level smoke sample value ADC1 to the first input terminal of the AND gate 531 when the smoke concentration detected by the smoke alarm 1 has reached the preset concentration threshold, and the comparator A2 outputs a high level voltage to the second input terminal of the AND gate 531 when the ambient temperature exceeds the preset temperature threshold. An output terminal of the AND gate 531 outputs a high level voltage indicating a smoke alarm signal when the first input terminal and the second input terminal of the AND gate 531 both receive a high level voltage. The output terminal of the AND gate 531 outputs a low level voltage indicating the smoke alarm signal is not output if the smoke concentration detected by the smoke alarm 1 has not reached the preset concentration threshold (the smoke sample value ADC1 is now a low level voltage), or the ambient temperature has not exceeded the preset temperature threshold (at this time, the comparator A2 outputs a low level voltage). The output terminal of the AND gate 531 may be connected to an external device to send the smoke alarm signal out. For example, the external device may be a master device, or the external device may be a buzzer which will be triggered to beep upon receiving a smoke alarm signal. However, the specific type of the external device is not limited thereto.

Accordingly, the circuit structure of the above described analysis module 5 results in no output of a smoke alarm signal unless when the smoke alarm detects that the smoke concentration has reached the preset concentration threshold and that the temperature detector detects that the ambient temperature has reached the preset temperature threshold, thereby avoiding a false alarm caused by oversensitivity of a smoke alarm, and avoiding waste of manpower and material resources as much as possible.

In another example, when the thermistor Rr has a negative temperature coefficient, it may be configured that the inverting input terminal of the comparator A2 is used to receive the temperature sample value ADC2, and the non-inverting input terminal of the comparator A2 is used to input the reference voltage Vrfe. At this time, the temperature sample value ADC2 is greater than the reference voltage Vrfe when the ambient temperature has not reached the preset temperature threshold, and the comparator A2 outputs a low level voltage. The temperature sample value ADC2 is smaller than the reference voltage Vrfe when the ambient temperature exceeds the preset temperature threshold, and the output terminal of the comparator A2 outputs a high level voltage. In this way, the output terminal of the AND gate 531 does not output a high level voltage indicating a smoke alarm signal, unless the smoke alarm 1 detects that the smoke concentration has reached the preset concentration threshold and that the ambient temperature has exceeded the preset temperature threshold.

It shall be noted that, the embodiment does not impose any limitation to the specific circuit design of the comparator circuit 54 or how the comparator circuit 54 is connected to the second sampling circuit, and skilled persons in the art may design according to practical needs.

Figure 4C:
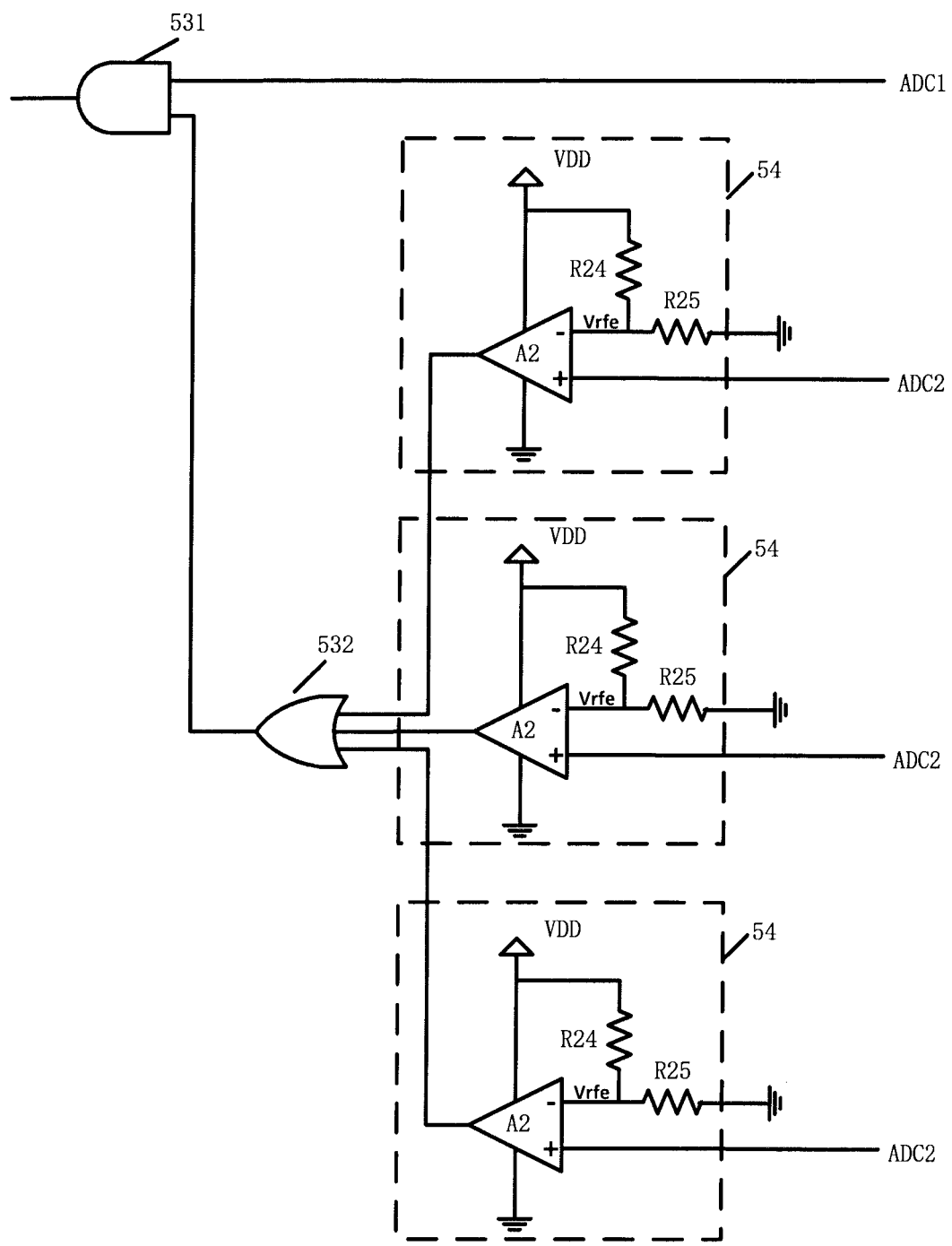
FIG. 4C is a schematic circuit diagram of the analysis module when there are a plurality of temperature detectors in the smoke alarm system.

FIG. 4C is a schematic circuit diagram of the analysis module 5 when there are a plurality of temperature detectors 2 in the smoke alarm system. When there are a plurality of temperature detectors 2, there are a plurality of second sampling circuits and a plurality of comparator circuits 54, and the logic gate circuit 53 includes the AND gate 531 and the OR gate 532. FIG. 4C shows a case where there are three comparator circuits when there are three temperature detectors 2, but does not impose any limitation to the number of the temperature detectors 2 (the number of the comparator circuits 54).

Specifically, the second terminal of the first sampling circuit 3 is connected to the first input terminal of the AND gate 531, the output terminal of each comparator circuit 54 is connected to an input terminal of the OR gate 532, and an output terminal of the OR gate 532 is connected to the second input terminal of the AND gate 531. The specific circuit structure of each comparator circuit 54 is the same as that in FIG. 4B, which will not be repeated here. When there are a plurality of temperature detectors 2, the OR gate 532 will output a high level voltage as long as the ambient temperature detected by one of the temperature detectors 2 is greater than the preset temperature threshold.

Figure 4D:
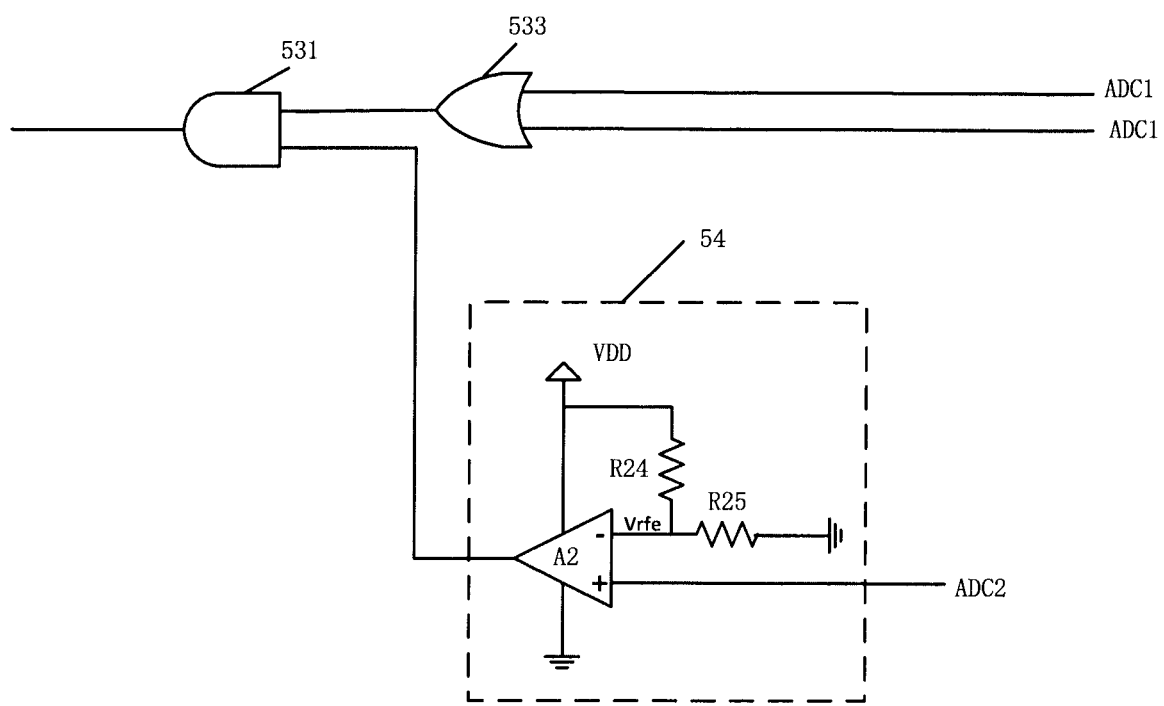
FIG. 4D is a schematic circuit diagram of the analysis module when there are a plurality of first filter branches in the smoke alarm system.

FIG. 4D is a schematic circuit diagram of the analysis module when there are a plurality of first filter branches in the smoke alarm system. The logic gate circuit 53 includes the AND gate 531 and the OR gate 533. In this embodiment, two first filter branches 32 are taken as an example for description.

Specifically, the second terminal of each first filter branch 32 is connected to an input terminal of the OR gate 533 to output the smoke sample value ADC1, the output terminal of the OR gate 533 is connected to the first input terminal of the AND gate 531. The second terminal of the second sampling circuit 4 is connected to the input terminal of the comparator circuit 54 to output the temperature sample value ADC2, the output terminal of the comparator circuit 54 is connected to the second input terminal of the AND gate 531. When there are at least two first filter branches 32, the OR gate 533 will output a high level voltage as long as the smoke sample value ADC1 detected by one of the first filter branches 32 is a high level voltage.

Figure 4E:
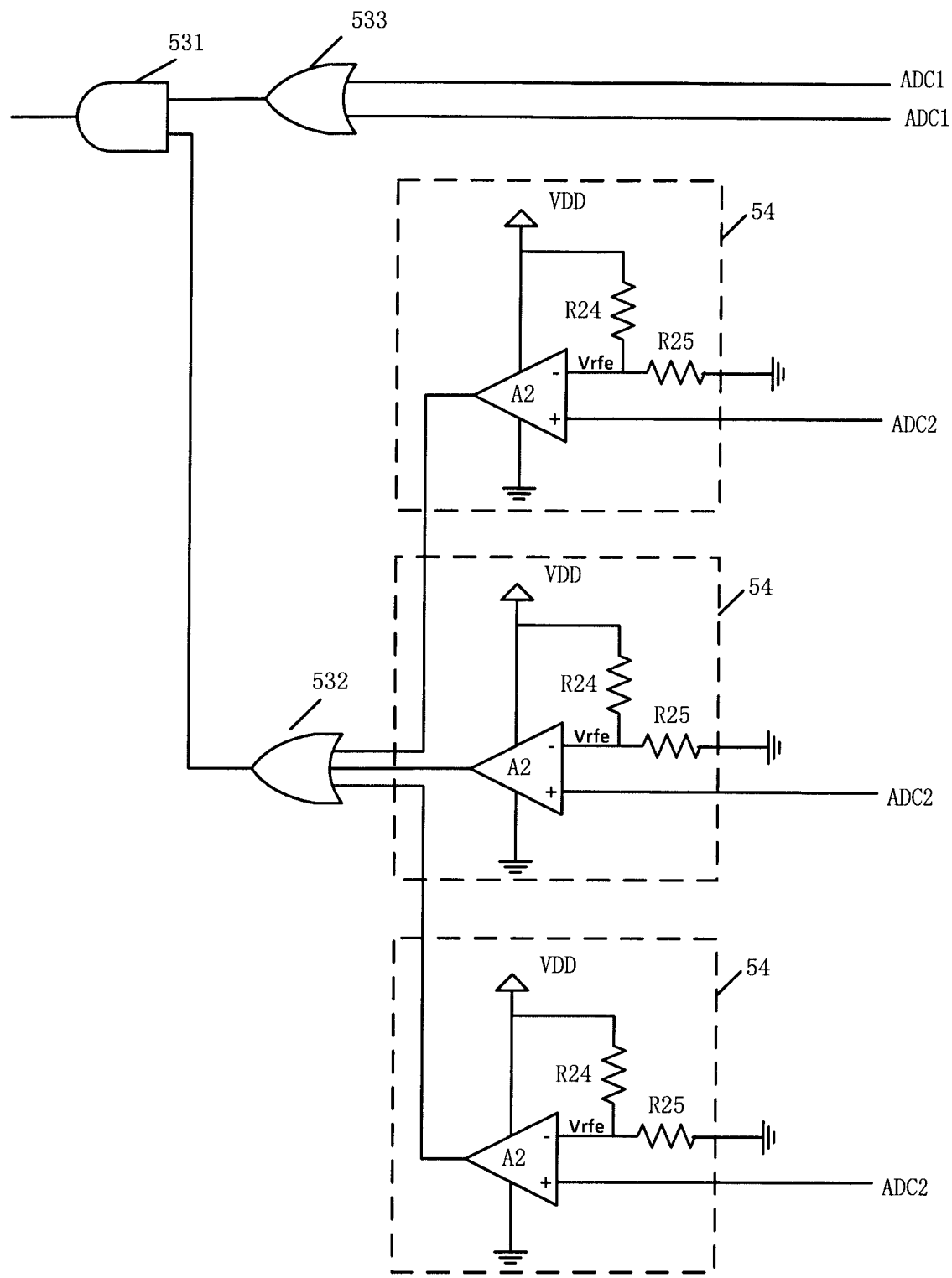
FIG. 4E is a schematic circuit diagram of the analysis module when there are a plurality of first filter branches and temperature detectors in the smoke alarm system.

FIG. 4E is a schematic circuit diagram of the analysis module when there are a plurality of first filter branches and temperature detectors in the smoke alarm system. The logic gate circuit 53 includes the AND gate 531 and two OR gates. The two OR gates are denoted as a first OR gate 533 and a second OR gate 532, respectively. In this embodiment, two first filter branches 32 are taken as an example for description.

Specifically, the second terminal of each first filter branch 32 is connected to one input terminal of the first OR gate 533 to output the smoke sample value ADC1, and an output terminal of the first OR gate 533 is connected to the first input terminal of the AND gate 531. The second terminal of each second sampling circuit 4 is connected to the input terminal of one comparator circuit 54 to output the temperature sample value ADC2. The output terminal of each comparator circuit 54 is connected to the input terminal of the second OR gate 532. The output terminal of the second OR gate 532 is connected to the second input terminal of the AND gate 531.

The above-described FIGS. 4B-4E show specific examples of the analysis module of the smoke alarm system being implemented in circuits; however the embodiment is not limited thereto. For example, in another example, the analysis module 5 may be a micro control unit MCU. That is, the MCU may determine whether a smoke alarm signal is generated according to the smoke sample value ADC1 and the temperature sample value ADC2. To be specific, the analysis module 5 may be a programmable chip, which may receive the ADC sample values, compare the ADC sample values with corresponding preset values in software, and determine whether a smoke alarm signal is generated.

In the smoke alarm system, there may be one temperature detector that may collect a temperature sample value at one point, or there may be a plurality of temperature detectors that may collect a plurality of temperature sample values at different points.

Figure 5:
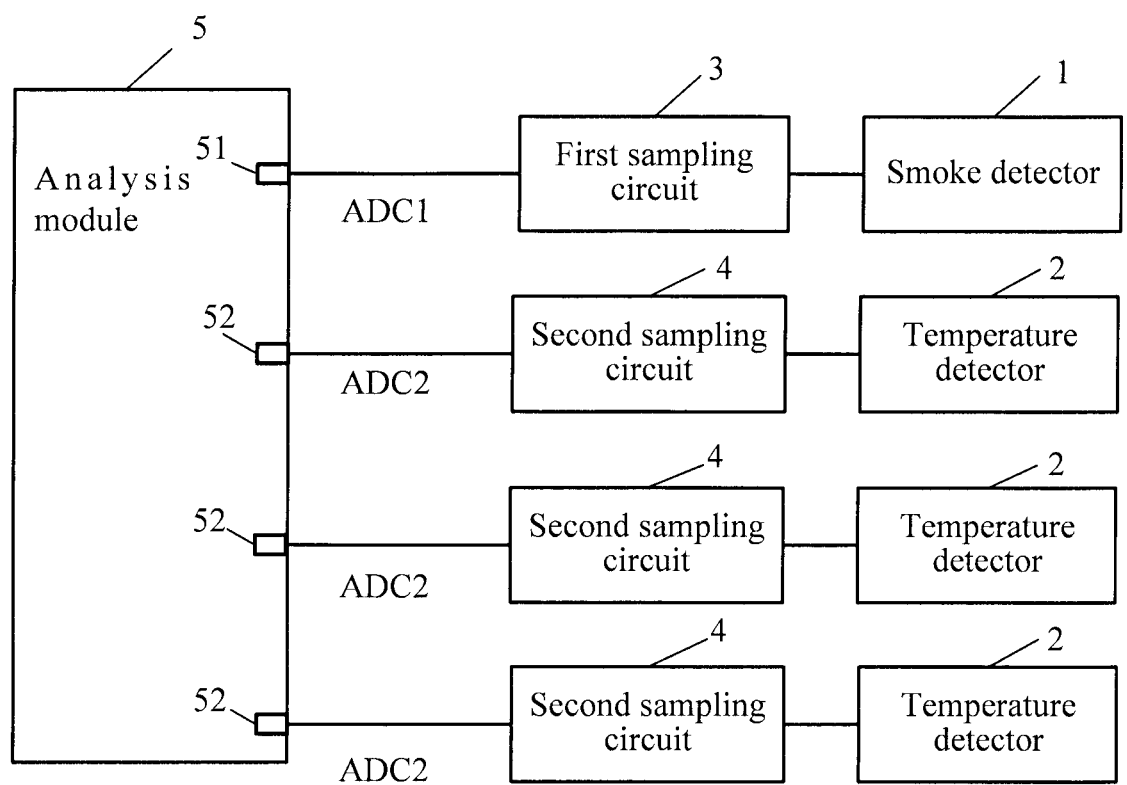
FIG. 5 is a block schematic diagram when there are a plurality of temperature detectors in the smoke alarm system.

FIG. 5 is a block schematic diagram when there are a plurality of temperature detectors in the smoke alarm system. The second sampling circuits 4 and the temperature detectors 2 are equal in number and are in one-to-one correspondence; the second input terminals 52 of the analysis module 5 and the second sampling circuits are equal in number and are in one-to-one correspondence. In the example of FIG. 5, there are three temperature detectors 2. Correspondingly, there are three second sampling circuits 4, and three second input terminals 52 of the analysis module 5. Each temperature detector 2 is connected to a second input terminal 52 of the analysis module 5 via a second sampling circuit 4. The three temperature detectors 2 may be respectively configured on the top, the interior, and the outlet of the electric cabinet. It shall be noted that this embodiment does not impose any limitation to the specific number and positions of the temperature detectors 2. FIG. 5 is merely an exemplary description, and skilled persons in the art may set the number and positions of the temperature detectors 2 according to practical conditions.

In this case, it is configured a plurality of temperature detectors 2 which are placed at different positions of the electric cabinet, so that ambient temperatures at different positions of the electric cabinet may be detected, making judgments more accurate.

In the smoke alarm system, the first sampling circuit 3 may include one first filter branch 32, or, the first sampling circuit 3 may include at least two first filter branches 32.

Figure 6:
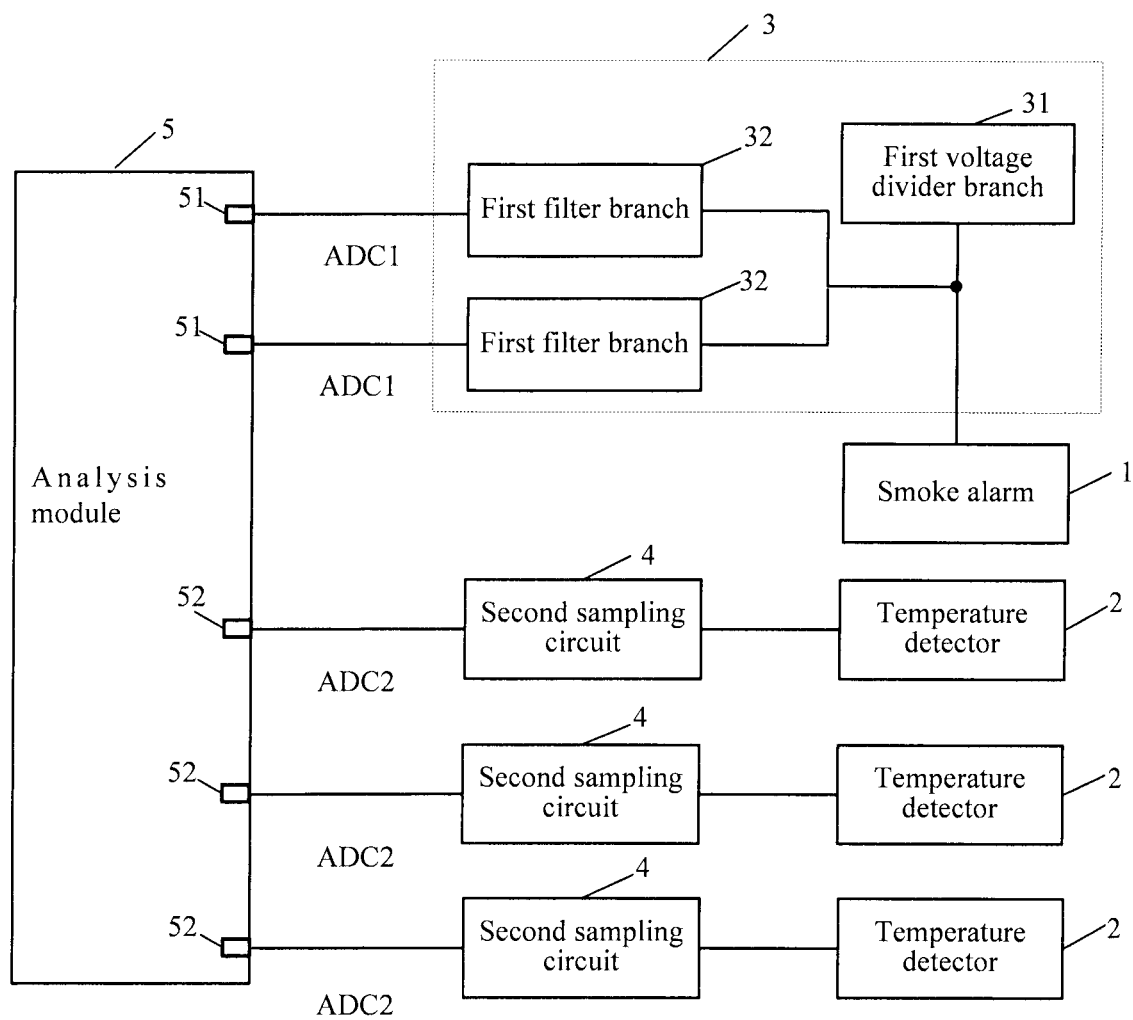
FIG. 6 is a block schematic diagram when there are a plurality of first filter branches in the smoke alarm system.

FIG. 6 is a block schematic diagram when there are a plurality of first filter branches in the smoke alarm system. The first input terminals 51 of the analysis module 5 and the first filter branches 32 are equal in number and are in one-to-one correspondence. In the example of FIG. 6, there are two first filter branches 32. Correspondingly, there are two first input terminals 51 of the analysis module 5. The first terminal of each first filter branch 32 is connected to the first terminal of the first voltage divider branch 31, and the second terminal of each first filter branch 32 is connected to one first input terminal 51 of the analysis module 5. It shall be noted that, this embodiment does not impose limitation to the specific number of the first filter branches 32, and FIG. 6 is merely an exemplary description, and skilled persons in the art may set the number of the first filter branches 32 according to practical conditions.

The first sampling circuit 3, the second sampling circuit 4 and the analysis module 5 are integrated on a printed circuit board. Alternatively, in a smoke alarm device integrating the first sampling circuit 3 and the smoke alarm 1 in the existing technologies, the first sampling circuit 3 only has one first sampling circuit 3 and one first filter branch 32, so another first filter branch 32, second sampling circuit 4 and analysis module 5 may be integrated on one printed circuit board. The first terminal of the first filter branch 32 integrated on the printed circuit board is electrically connected to the first terminal of the sampling circuit 31 in the smoke alarm device. That is, if the number of the first filter branches 32 set is N, N−1 first filter branches 32 may be integrated on one printed circuit board.

In this case, at least two first filter branches are designed to output at least two smoke sample values. That is, a design of multi-channel sampling of smoke concentration is used to replace a design of single-channel sampling in the existing technologies, which may avoid false alarm due to error caused by single sampling.

Figure 7:
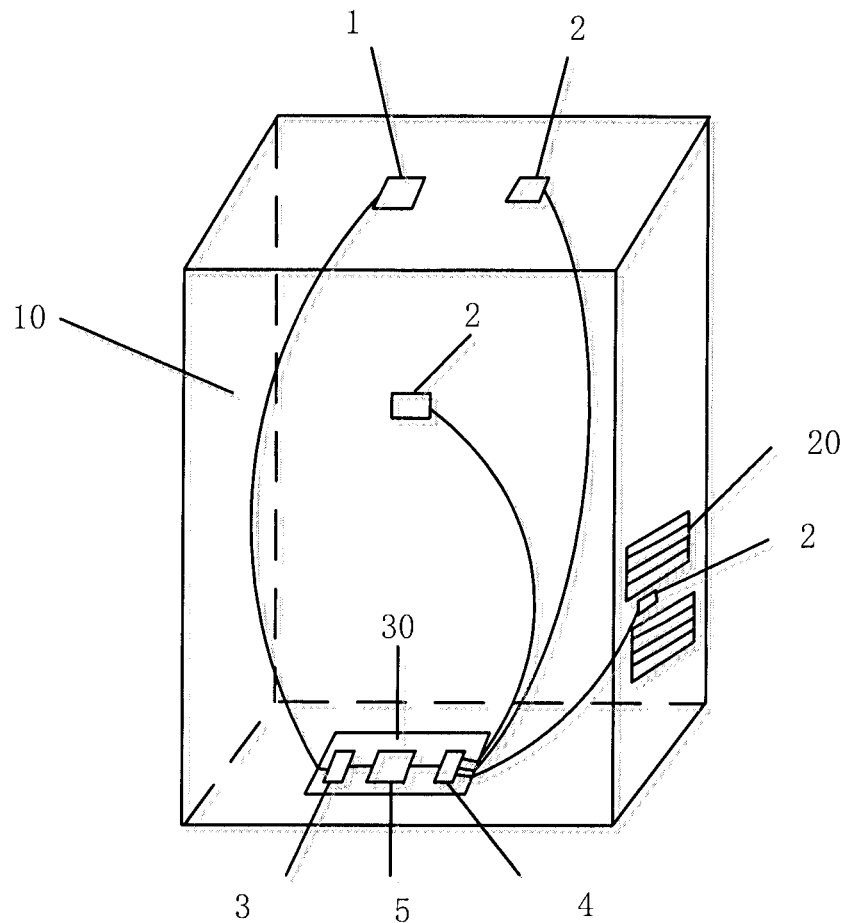
FIG. 7 is a structural schematic diagram of the smoke alarm system applied to the electric cabinet in an energy storage system.

FIG. 7 is a structural schematic diagram of the smoke alarm system applied to the electric cabinet 10 in the energy storage system. The smoke alarm 1 is configured on a top of the electric cabinet 10, and there are three temperature sensors 2, a first temperature sensor 2 is configured inside of the electric cabinet 10, a second temperature sensor 2 is configured on the top of the electric cabinet 10 and a third temperature sensor 2 is configured at an air outlet of the electric cabinet 10. The first sampling circuit 3, the second sampling circuit 4 and the analysis module 5 are integrated on one printed circuit board 30 configured inside the electric cabinet 10. The first sampling circuit 3 is electrically connected to the smoke alarm 1 via a wire, the second sampling circuit 4 is electrically connected to the three temperature sensor 2 via wires respectively, the analysis module 5 is further electrically connected to the first sampling circuit 3 and the second sampling circuit 4 via wires respectively. The connection lines in FIG. 7 are merely used for schematically illustrate the electrical connection relationships among the smoke alarm 1, temperature sensors and the sampling circuits and the like, rather than an actual circuit arrangement in the electric cabinet.

Figure 8:
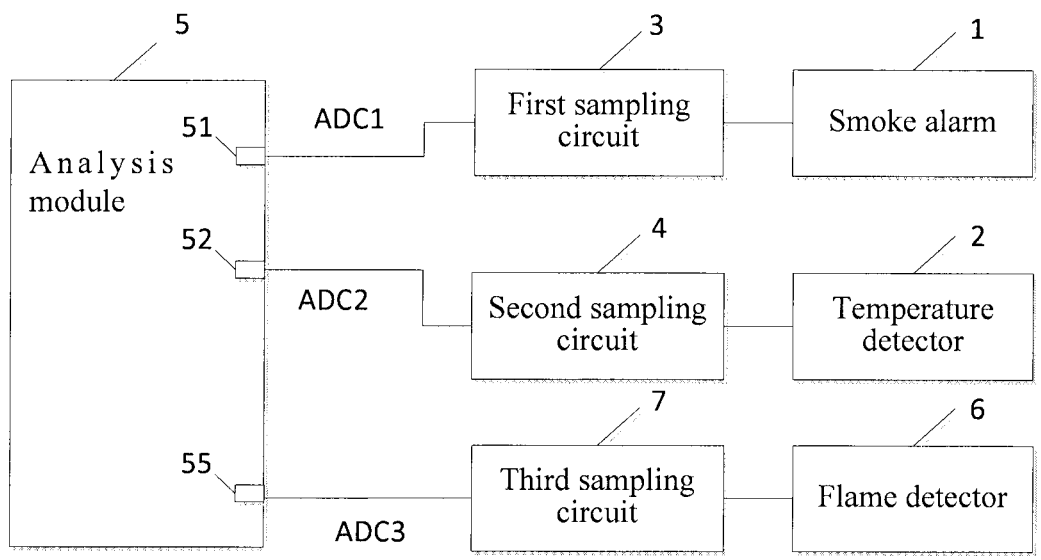
FIG. 8 is a block schematic diagram of another smoke alarm system in accordance with the present disclosure.

The smoke alarm system may further includes a flame detector, as shown in FIG. 8, including a smoke alarm 1, a temperature detector 2, a flame detector 6, a first sampling circuit 3, a second sampling circuit 4, a third sampling circuit 7, and an analysis module 5. A first terminal of the first sampling circuit 3 is connected to the smoke alarm 1, and a second terminal of the first sampling circuit 3 is connected to a first input terminal 51 of the analysis module 5; the first sampling circuit is used for sampling from the smoke alarm 2 to obtain a smoke sample value ADC1 which is then output to the analysis module 5. A first terminal of the second sampling circuit 4 is connected to the temperature detector 2, and a second terminal of the second sampling circuit 4 is connected to a second input terminal 52 of the analysis module 5; the second sampling circuit 4 is used for sampling from the temperature detector 2 to obtain a temperature sample value ADC2 which is then output to the analysis module 5. A first terminal of the third sampling circuit 7 is connected to the flame detector 6, and a second terminal of the third sampling circuit 7 is connected to a third input terminal 55 of the analysis module 5; the third sampling circuit 7 is used for sampling from the flame detector 6 to obtain a flame sample value ADC3 which is then output to the analysis module 5. The analysis module 5 is used for determining whether a smoke alarm signal is generated in accordance with the smoke sample value ADC1, the temperature sample value ADC2 and the flame sample value ADC3. The skilled person can understand that the temperature detector may be a temperature sensor, and the flame detector may be a flame sensor.

The first sampling circuit 3 samples from the smoke alarm 1 to obtain a smoke sample value ADC1 which is then output to the analysis module 5; the second sampling circuit 4 samples from the temperature detector 2 to obtain a temperature sample value ADC2 which is then output to the analysis module 5; the third sampling circuit 7 samples from the flame detector 6 to obtain a flame sample value ADC3 which is then output to the analysis module 5. That is, the smoke detection ADC1, the temperature detection ADC2 and the flame sample value ADC3 are combined to determine whether a smoke alarm signal is generated, which further increase the recognition accuracy of the smoke alarm system, so as to avoid a false alarm because of oversensitivity of a smoke alarm, so as to avoid waste of manpower and material resources as much as possible.

The flame detector 6 and the third sampling circuit 7 form a flame detecting module for detecting flame. When there is a flame detected by the flame detector 6, the flame sample value ADC3 output by the third sampling circuit 7 is at a low level (or high level); when there is no flame detected by the flame detector 6, the flame sample value ADC3 output by third sampling circuit 7 is at a high level (or low level). That is, the flame sample value ADC3 reflects whether there is a flame in the environment.

An exemplary circuit structure of the flame detector 6 may be referred to the above smoke alarm 1. Similar to FIG. 3A, the flame detector may include a flame detecting unit and a switch. When the flame detecting unit detects that there is a flame in the environment, the switch is controlled to be ON so that the circuit is turned on. The switch is used to exemplarily show the connection relationship between the flame detector and the third sampling circuit, but the actual structure of the flame detector is not limited in any way.

Regarding to the position configuration of the flame detector 6 in the smoke alarm system applied to the electric cabinet 10 in the energy storage system, similar to FIG. 7, the flame detector may be configured inside the electric cabinet, the printed circuit board may be further provided with the third sampling circuit, and the third sampling circuit is electrically connected to the flame detector by a wire. In an example, the flame detector may be replaced by a second smoke alarm, which can further improve the accuracy of smoke detection. On the other hand, due to the similar circuit structure of the flame detector and the smoke alarm, an operator may easily maintain or replace the flame detector and the smoke alarm, which helps to improve flexibility of the configuration and schedule of the smoke alarm system.

Figure 9:
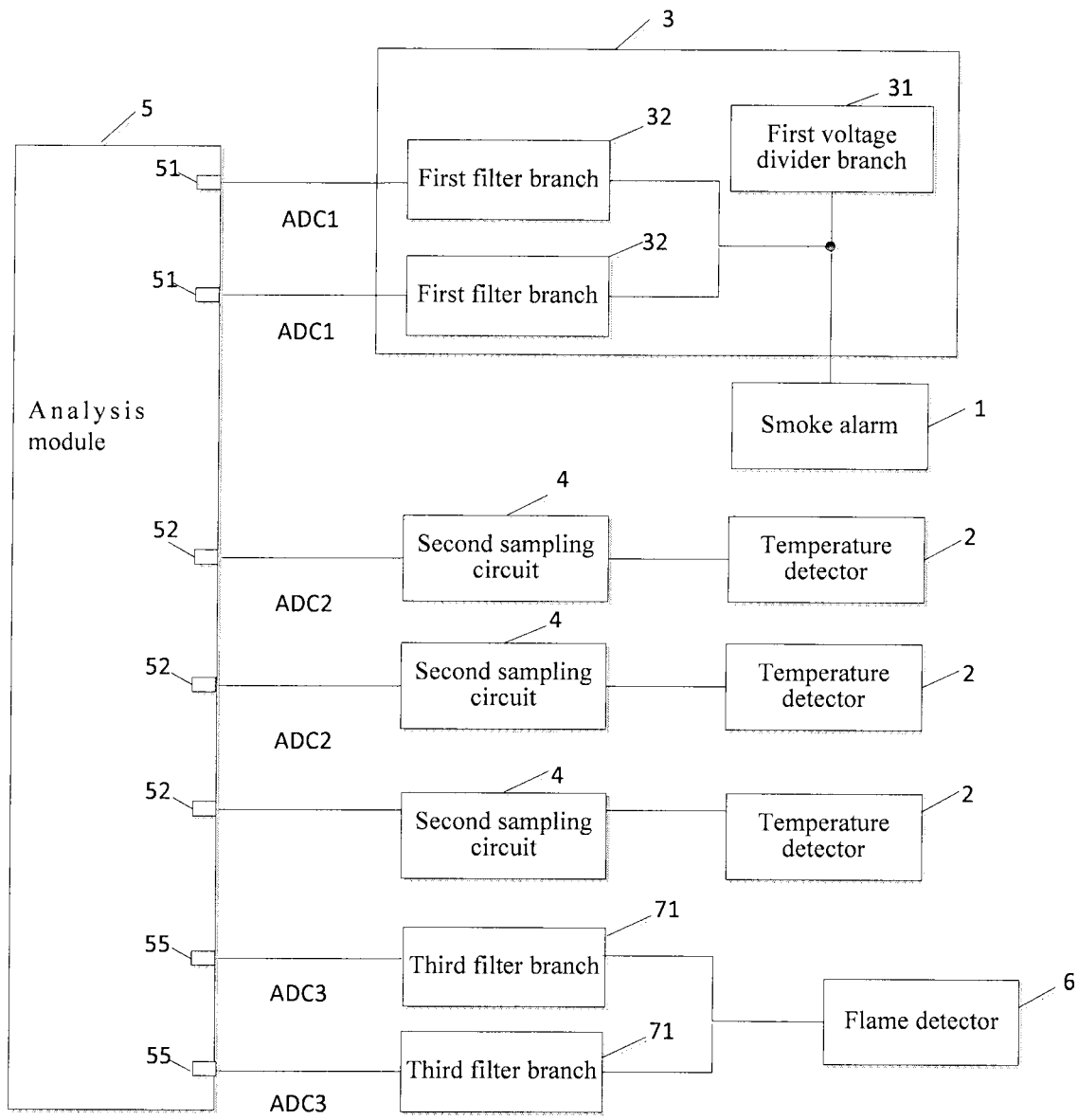
FIG. 9 is a block schematic diagram when there are a plurality of third filter branches in the smoke alarm system.

FIG. 9 is a block schematic diagram when there are a plurality of third filter branches in the third sampling circuit. The third input terminals 55 of the analysis module 5 and the third filter branches 71 are equal in number and are in one-to-one correspondence. In the example of FIG. 9, there are two third filter branches 71. Correspondingly, there are two third input terminals 55 of the analysis module 5. The first terminal of each third filter branch 71 is connected to the flame detector 6, and the second terminal of each third filter branch 71 is connected to one third input terminal 55 of the analysis module 5. In this case, at least two third filter branches are designed to output at least two flame sample values. That is, a design of multi-channel sampling of burning situation of the flame is used to replace a design of single-channel sampling in the existing technologies, which may avoid false alarm due to error caused by single sampling.

It shall be noted that, this embodiment does not impose limitation to the specific number of the third filter branches 71, and FIG. 9 is merely an exemplary description, and skilled persons in the art may set the number of the third filter branches 71 according to practical conditions.

Figure 10:
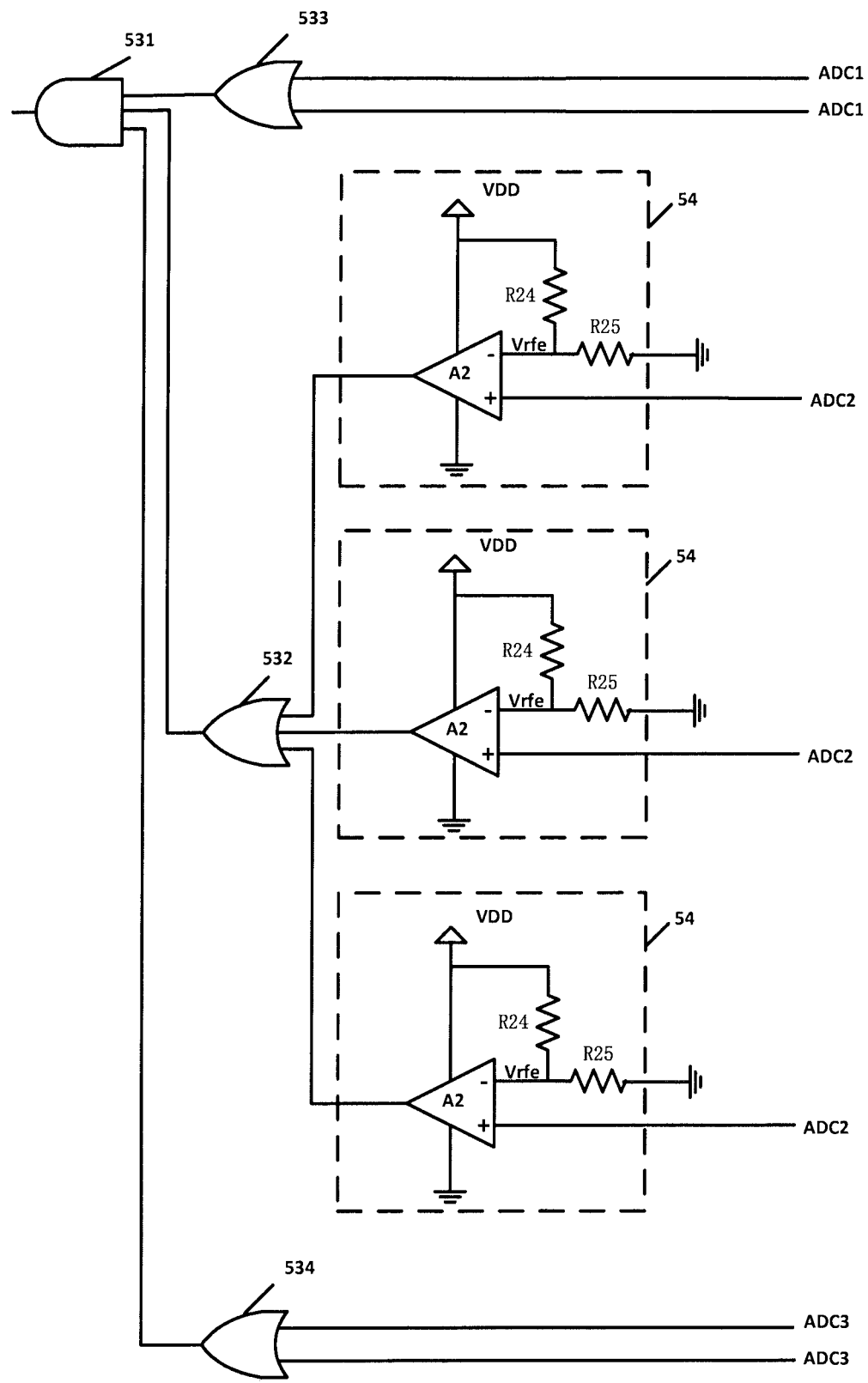
FIG. 10 is a schematic circuit diagram of the analysis module when there are a plurality of third filter branches of the third sampling circuit in the smoke alarm system.

When there are a plurality of first filter branches, temperature detectors and third filter branches in the smoke alarm system, on the basis of FIG. 4E, the logic gate circuit 53 may further includes a further OR gate connecting to the plurality of third filter branches. In an example as shown in FIG. 10, two third filter branches 71 are connected to input terminals of the OR gate 534 respectively to output the flame sample value ADC3, an output terminal of the OR gate 534 is connected to an input terminal of the AND gate 531. A circuit solution of the analysis module is provided. In this case, the analysis module 5 results in no output of a smoke alarm signal unless when the smoke alarm detects that the smoke concentration has reached the preset concentration threshold and that the temperature detector detects that the ambient temperature has reached the preset temperature threshold and that the flame detector detects that there is a flame in the environment, thereby avoiding a false alarm caused by oversensitivity of a smoke alarm, and avoiding waste of manpower and material resources as much as possible.

Similarly, the skilled person can understand that, the analysis module 5 may be a micro control unit MCU. That is, the MCU may determine whether a smoke alarm signal is generated according to the smoke sample value ADC1, the temperature sample value ADC2 and the flame sample value ADC3. To be specific, the analysis module 5 may be a programmable chip, which may receive those ADC sample values, compare the ADC sample values with corresponding preset values in software, and determine whether a smoke alarm signal is generated.

Skilled persons in the art may appreciate that the above embodiments are specific embodiments for implementing the present disclosure, but in practical application, various changes may be made in the form and details without departing from the spirit and scope of the present disclosure.

What is claimed is:

1. A smoke alarm system, comprising: a smoke alarm, a temperature detector, a first sampling circuit, a second sampling circuit and an analysis module;

wherein a first terminal of the first sampling circuit is connected to the smoke alarm, and a second terminal of the first sampling circuit is connected to a first input terminal of the analysis module; wherein the first sampling circuit is used for sampling from the smoke alarm to obtain a smoke sample value and outputting the smoke sample value to the analysis module;

wherein a first terminal of the second sampling circuit is connected to the temperature detector, and a second terminal of the second sampling circuit is connected to a second input terminal of the analysis module; wherein the second sampling circuit is used for sampling from the temperature detector to obtain a temperature sample value and outputting the temperature sample value to the analysis module; and wherein the analysis module is used for determining whether a smoke alarm signal is generated according to the smoke sample value and the temperature sample value; the analysis module is configured to output the smoke alarm signal when the smoke alarm detects that the smoke concentration has reached the preset concentration threshold and when the temperature detector detects that the ambient temperature has reached the preset temperature threshold, the analysis module comprises a logic gate circuit and a comparator circuit;

wherein the second terminal of the first sampling circuit is connected to a first input terminal of the logic gate circuit; and wherein the comparator circuit and the second sampling circuit are equal in number and are in one-to-one correspondence, the second terminal of each second sampling circuit is connected to an input terminal of each comparator circuit, and an output terminal of each comparator circuit is connected to a second input terminal of the logic gate circuit.

2. The smoke alarm system according to claim 1, wherein the first sampling circuit comprises a first voltage divider branch and a first filter branch, wherein a first terminal of the first voltage divider branch is connected to a first terminal of the smoke alarm; and wherein a first terminal of the first filter branch is connected to the first terminal of the first voltage divider branch, and a second terminal of the first filter branch is connected to the first input terminal of the analysis module.

3. The smoke alarm system according to claim 2, wherein a second terminal of the first voltage divider branch is a power supply terminal and a second terminal of the smoke alarm is a ground terminal.

4. The smoke alarm system according to claim 1, wherein the first sampling circuit comprises a first voltage divider branch and at least two first filter branches; wherein the first input terminal of the analysis module and the first filter branch are equal in number and are in one-to-one correspondence;

wherein a first terminal of the first voltage divider branch is connected to a first terminal of the smoke alarm; and wherein a first terminal of each of the first filter branches is connected to the first terminal of the first voltage divider branch, and a second terminal of each of the first filter branches is connected to one of the first input terminals of the analysis module.

5. The smoke alarm system according to claim 4, wherein a second terminal of the first voltage divider branch is a power supply terminal and a second terminal of the smoke alarm is a ground terminal.

6. The smoke alarm system according to claim 4, wherein the analysis module comprises a logic gate circuit and a comparator circuit; there are a plurality of second sampling circuits; the comparator circuits and the second sampling circuits are equal in number and are in one-to-one correspondence;

wherein the logic gate circuit comprises an AND gate and two OR gates;

wherein the second terminal of each of the first filter branches is connected to an input terminal of a first OR gate, and an output terminal of the first OR gate is connected to a first input terminal of the AND gate; and wherein the second terminal of each of the second sampling circuits is connected to an input terminal of one of the comparator circuits, and an output terminal of each of the comparator circuits is connected to an input terminal of a second OR gate; and an output terminal of the second OR gate is connected to a second input terminal of the AND gate.

7. The smoke alarm system according to claim 4, wherein there are a plurality of temperature detectors which are in one-to-one correspondence to a plurality of second sampling circuits; wherein the second input terminals of the analysis module and the second sampling circuits are equal in number and are in one-to-one correspondence;

wherein the first terminal of each of the second sampling circuits is connected to the first terminal of one temperature detector, and the second terminal of each of the second sampling circuits is connected to the second input terminal of one analysis module.

8. The smoke alarm system according to claim 1, wherein the second sampling circuit comprises a second voltage divider branch and a second filter branch;

wherein a first terminal of the second voltage divider branch is connected to the first terminal of the temperature detector; and wherein a first terminal of the second filter branch is connected to the first terminal of the second voltage divider branch, and a second terminal of the second filter branch is connected to the second input terminal of the analysis module.

9. The smoke alarm system according to claim 8, wherein the second sampling circuit further comprises a voltage follower branch via which the second voltage divider branch is connected to the second filter branch.

10. The smoke alarm system according to claim 1, wherein there are a plurality of temperature detectors which are in one-to-one correspondence to a plurality of second sampling circuits; wherein the second input terminals of the analysis module and the second sampling circuits are equal in number and are in one-to-one correspondence;

wherein the first terminal of each of the second sampling circuits is connected to the first terminal of one temperature detector, and the second terminal of each of the second sampling circuits is connected to the second input terminal of one analysis module.

11. The smoke alarm system according to claim 10, wherein each of the second sampling circuits comprises a second voltage divider branch and a second filter branch;

wherein a first terminal of the second voltage divider branch is connected to the first terminal of one temperature detector; and wherein a first terminal of the second filter branch is connected to the first terminal of one second voltage divider branch, and a second terminal of the second filter branch is connected to the second input terminal of one analysis module.

12. The smoke alarm system according to claim 10, wherein each of the second sampling circuits further comprises a voltage follower branch via which the second voltage divider branch is connected to the second filter branch.

13. The smoke alarm system according to claim 1, wherein there is one second sampling circuit and the logic gate circuit is an AND gate; or wherein there are a plurality of second sampling circuits, and the logic gate circuit comprises an AND gate and an OR gate;

wherein the second terminal of the first sampling circuit is connected to a first input terminal of the AND gate; and wherein the output terminal of each comparator circuit is connected to an input terminal of the OR gate, and an output terminal of the OR gate is connected to a second input terminal of the AND gate.

14. The smoke alarm system according to claim 1, wherein the analysis module is a micro control unit.

15. The smoke alarm system according to claim 1, wherein the smoke alarm system is applied to an electric cabinet;
- wherein the smoke alarm is configured on a top of the electric cabinet;
- wherein there are three temperature detectors, a first temperature detector configured inside of the electric cabinet, a second temperature detector configured on the top of the electric cabinet and a third temperature detector configured at an air outlet of the electric cabinet.

16. The smoke alarm system according to claim 1, wherein the first sampling circuit, the second sampling circuit and the analysis module are integrated on one printed circuit board.

17. The smoke alarm system according to claim 1, further comprising a flame detector and a third sampling circuit;
- wherein a first terminal of the third sampling circuit is connected to the flame detector, and a second terminal of the third sampling circuit is connected to a third input terminal of the analysis module; wherein the third sampling circuit is used for sampling from the flame detector to obtain a flame sample value and outputting the flame sample value to the analysis module; and
- wherein the analysis module is further used for determining whether a smoke alarm signal is generated according to the smoke sample value, the temperature sample value and the flame sample value.

18. The smoke alarm system according to claim 17, wherein the third sampling circuit comprises at least two third filter branches; wherein a third input terminal of the analysis module and the third filter branch are equal in number and are in one-to-one correspondence;
- wherein a first terminal of each of the third filter branches is connected to the flame detector, and a second terminal of each of the third filter branches is connected to one of the third input terminals of the analysis module.

19. The smoke alarm system according to claim 18, wherein there are a plurality of temperature detectors which are in one-to-one correspondence to a plurality of second sampling circuits; wherein the second input terminals of the analysis module and the second sampling circuits are equal in number and are in one-to-one correspondence;
- wherein the first terminal of each of the second sampling circuits is connected to the first terminal of one temperature detector, and the second terminal of each of the second sampling circuits is connected to the second input terminal of one analysis module.

* * * * *